US010663287B2

(12) United States Patent
Kimba et al.

(10) Patent No.: US 10,663,287 B2
(45) Date of Patent: May 26, 2020

(54) POLISHING APPARATUS

(71) Applicant: EBARA CORPORATION, Tokyo (JP)

(72) Inventors: Toshifumi Kimba, Tokyo (JP);
Nobuyuki Takahashi, Tokyo (JP);
Masaki Kinoshita, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/248,599

(22) Filed: Jan. 15, 2019

(65) Prior Publication Data

US 2019/0219381 A1 Jul. 18, 2019

(30) Foreign Application Priority Data

Jan. 18, 2018 (JP) .................. 2018-006358

(51) Int. Cl.
*G01B 11/06* (2006.01)
*B24B 37/005* (2012.01)
(Continued)

(52) U.S. Cl.
CPC ........ *G01B 11/0633* (2013.01); *B24B 37/005* (2013.01); *B24B 37/34* (2013.01); *B24B 49/12* (2013.01); *G02B 6/266* (2013.01); *H01L 21/67092* (2013.01); *H01L 21/67253* (2013.01); *G02B 6/3506* (2013.01)

(58) Field of Classification Search
CPC ..... B24B 37/005; B24B 37/013; B24B 37/34; B24B 49/12; H01L 21/67092; H01L 21/67253; H01L 21/67219; H01L 21/304; H01L 2224/03616; H01L 22/12; H01L 22/26; G02B 6/0001; G02B 6/0005; G02B 6/0006; G02B 6/0008; G02B 6/266; G02B 6/3506; G01B 11/06; G01B 11/0616; G01B 11/0625; G01B 11/0633; G01B 11/0683; G01B 11/0691; G01B 11/10; G01B 11/22; G01B 11/608; G01B 11/303
USPC ......... 451/5, 6, 8, 9, 66; 356/73.1, 625–632, 356/638, 639, 402, 426, 600, 601, 624, 356/300, 302, 303, 308, 310, 319,
(Continued)

(56) References Cited

U.S. PATENT DOCUMENTS 5,812,710 A * 9/1998 Sugaya ................. H01S 3/1301
359/337
2012/0196511 A1* 8/2012 David ................... B24B 37/013
451/6
(Continued)

FOREIGN PATENT DOCUMENTS

JP 2017-005014 A 1/2017
WO WO-2017000510 A1 * 1/2017 ............ G02B 6/42

*Primary Examiner* — Christina A Riddle
(74) *Attorney, Agent, or Firm* — BakerHostetler

(57) ABSTRACT

A polishing apparatus capable of accurately measuring a film thickness by regulating a quantity of light illuminating a wafer is disclosed. The polishing apparatus includes: a light source; an illuminating fiber having distal ends arranged at different locations in the polishing table; and a light-receiving fiber having distal ends arranged at the different locations in the polishing table. The illuminating fiber includes a first illuminating fiber and a second illuminating fiber. A first dimmer is attached to the first illuminating fiber and the second illuminating fiber, and a second dimmer is attached to at least one of the first illuminating fiber and the second illuminating fiber.

11 Claims, 13 Drawing Sheets

(51) Int. Cl.
    *B24B 49/12*     (2006.01)
    *H01L 21/67*     (2006.01)
    *B24B 37/34*     (2012.01)
    *G02B 6/26*     (2006.01)
    *G02B 6/35*     (2006.01)

(58) Field of Classification Search
    USPC ....... 356/326–330, 451, 237.1, 237.2–237.5, 356/244
    See application file for complete search history.

(56) References Cited

U.S. PATENT DOCUMENTS

2016/0227992 A1*   8/2016   Yoshino .................... A61B 1/06
2018/0196205 A1*   7/2018   Song ......................... G02B 6/42
2019/0017808 A1*   1/2019   Kimba ................. B24B 37/013

* cited by examiner

POLISHING APPARATUS

CROSS REFERENCE TO RELATED APPLICATION

This document claims priority to Japanese Patent Application Number 2018-6358 filed Jan. 18, 2018, the entire contents of which are hereby incorporated by reference.

BACKGROUND

Manufacturing processes of semiconductor devices include a process of polishing a dielectric film, e.g., $SiO_2$, and a process of polishing a metal film, e.g., copper or tungsten. Manufacturing processes of backside illumination CMOS sensor and through-silicon via (TSV) include a process of polishing a silicon layer (silicon wafer), in addition to the polishing processes of the dielectric film and the metal film. Polishing of a wafer is terminated when a thickness of a film (e.g., the dielectric film, the metal film, or the silicon layer), constituting a wafer surface, has reached a predetermined target value.

Polishing of a wafer is carried out using a polishing apparatus. In order to measure a film thickness of a non-metal film, such as a dielectric film or a silicon layer, the polishing apparatus generally includes an optical film-thickness measuring device. This optical film-thickness measuring device is configured to direct a light, which is emitted from a light source, to a surface of the wafer, to measure intensity of reflected light from the wafer with a spectrometer, and to analyze a spectrum of the reflected light to thereby measure the film thickness of the wafer.

In the optical film-thickness measuring device, a quantity of light emitted by the light source influences measuring of the film-thickness of the wafer. For example, if quantities of light, directed to a plurality of measurement points on the wafer, are different from each other, the accuracy of the film-thickness measurement changes due to a difference in optical conditions. As a result, even if the film thickness of the wafer is the same, a measured value of the film thickness can vary. Furthermore, if the quantity of reflected light from the wafer is too large relative to an effective measuring range of the spectrometer, measuring of an accurate film thickness is hindered.

SUMMARY OF THE INVENTION

According to an embodiment, there is provided a polishing apparatus capable of accurately measuring a film thickness by regulating a quantity of light illuminating a wafer.

Embodiments, which will be described below, relate to a polishing apparatus for polishing a wafer having a film forming a surface thereof, and more particularly to a polishing apparatus for polishing a wafer, while detecting a film thickness of the wafer by analyzing optical information contained in reflected light from the wafer.

In an embodiment, there is provided a polishing apparatus comprising: a polishing table for supporting a polishing pad; a polishing head configured to press a wafer against the polishing pad; a light source; an illuminating fiber having distal ends arranged at different locations in the polishing table; a light-receiving fiber having distal ends arranged at the different locations in the polishing table; a spectrometer coupled to the light-receiving fiber, the spectrometer being configured to decompose reflected light, transmitted from the wafer through the light-receiving fiber, according to wavelength and measure intensity of the reflected light at each of wavelengths; a processor configured to determine a film thickness of the wafer based on a spectral waveform indicating a relationship between the intensity and the wavelength of the reflected light; and a first dimmer and a second dimmer attached to the illuminating fiber, wherein the illuminating fiber includes a first illuminating fiber and a second illuminating fiber, one ends of the first illuminating fiber and the second illuminating fiber are coupled to the light source, other ends of the first illuminating fiber and the second illuminating fiber constitute the distal ends of the illuminating fiber arranged at the different locations, and the first dimmer is attached to the first illuminating fiber and the second illuminating fiber, and the second dimmer is attached to at least one of the first illuminating fiber and the second illuminating fiber.

In an embodiment, each of the first dimmer and the second dimmer includes: a base member having a light passage formed therein; an optical-fiber holder inserted in the light passage; and a relative-position adjusting mechanism configured to adjust a position of the optical-fiber holder relative to the base member.

In an embodiment, the optical-fiber holder has a scale on an outer surface thereof.

In an embodiment, the relative-position adjusting mechanism includes a motor-driven moving mechanism configured to move the optical-fiber holder relative to the base member.

In an embodiment, the polishing apparatus further comprises an operation controller configured to operate the motor-driven moving mechanism of the first dimmer until a quantity of light, emitted from the illuminating fiber, reaches a target value.

In an embodiment, the polishing apparatus further comprises an operation controller configured to operate the motor-driven moving mechanism of the second dimmer until quantities of light, emitted from the first illuminating fiber and the second illuminating fiber, become equal to each other.

In an embodiment, each of the first dimmer and the second dimmer further includes a diaphragm disposed in the light passage.

In an embodiment, a part of the first illuminating fiber and a part of the second illuminating fiber are bound to constitute a trunk optical fiber; other part of the first illuminating fiber and other part of the second illuminating fiber constitute branch optical fibers branching off from the trunk optical fiber; and the first dimmer is attached to the trunk optical fiber, and the second dimmer is attached to at least one of the branch optical fibers.

In an embodiment, the polishing apparatus further comprises: a monitoring optical fiber coupled to the light source and the spectrometer; and a third dimmer attached to the monitoring optical fiber.

In an embodiment, there is provided a polishing apparatus comprising: a polishing table for supporting a polishing pad; a polishing head configured to press a wafer against the polishing pad; a light source; an illuminating fiber having a distal end arranged at a predetermined location in the polishing table; a light-receiving fiber having a distal end arranged at the predetermined location in the polishing table; a spectrometer coupled to the light-receiving fiber, the spectrometer being configured to decompose reflected light, transmitted from the wafer through the light-receiving fiber, according to wavelength and measure intensity of the reflected light at each of wavelengths; a processor configured to determine a film thickness of the wafer based on a spectral waveform indicating a relationship between the intensity and the wavelength of the reflected light; and a dimmer attached to the illuminating fiber.

In an embodiment, the dimmer includes: a base member having a light passage formed therein; an optical-fiber holder inserted in the light passage; and a relative-position adjusting mechanism configured to adjust a position of the optical-fiber holder relative to the base member.

In an embodiment, the optical-fiber holder has a scale on an outer surface thereof.

In an embodiment, the relative-position adjusting mechanism includes a motor-driven moving mechanism configured to move the optical-fiber holder relative to the base member.

In an embodiment, the polishing apparatus further comprises an operation controller configured to operate the motor-driven moving mechanism of the dimmer until a quantity of light, emitted from the illuminating fiber, reaches a target value.

In an embodiment, the dimmer further includes a diaphragm disposed in the light passage.

According to the above-described embodiments, the first dimmer can regulate the total quantity of light emitted from the light source. More specifically, the first dimmer can regulate the quantity of light from the light source such that the quantity of reflected light from the wafer falls within an effective measuring range of the spectrometer. Therefore, the spectrometer can correctly measure the intensity of the reflected light at each wavelength and as a result, accurate measuring of a film thickness can be achieved.

The second dimmer can balance the quantities of light directed from the first illuminating fiber and the second illuminating fiber to the wafer. Specifically, the second dimmer can equalize the quantities of light directed from the plurality of illuminating fibers to the wafer. As a result, the film thickness of the wafer can be measured under the same optical conditions at a plurality of measurement points on the wafer.

Further, according to the above-described embodiments, fine adjustment of the quantity of light transmitted through the illuminating fiber can be achieved by adjusting the position of the optical-fiber holder relative to the base member. Furthermore, the dimmer can regulate the quantity of light from the light source such that the quantity of reflected light from the wafer falls within an effective measuring range of the spectrometer. Therefore, the spectrometer can correctly measure the intensity of the reflected light at each wavelength and as a result, accurate measuring of the film thickness can be achieved.

DESCRIPTION OF EMBODIMENTS

Figure 1:
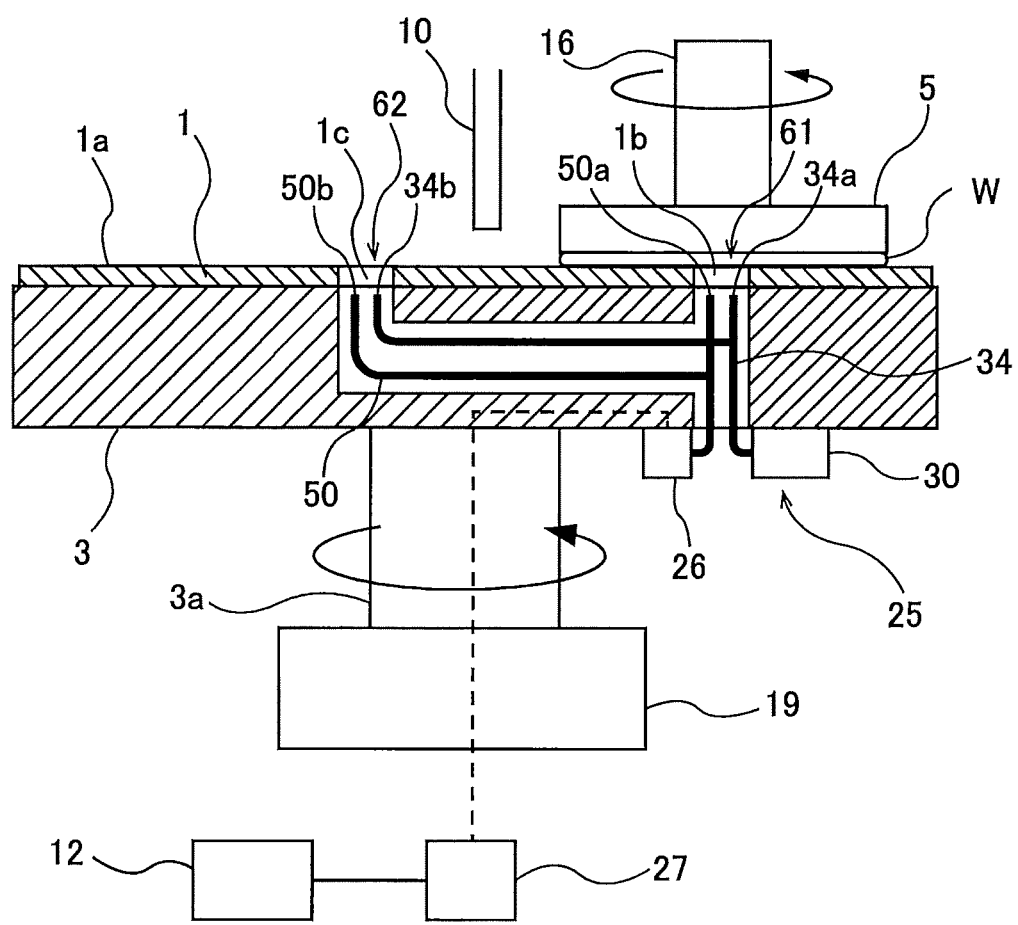
FIG. 1 is a view showing a polishing apparatus according to an embodiment.

Embodiments will be described below with reference to the drawings. FIG. 1 is a view showing an embodiment of a polishing apparatus. As shown in FIG. 1, the polishing apparatus includes a polishing table 3 supporting a polishing pad 1, a polishing head 5 for holding a wafer W and pressing the wafer W against the polishing pad 1 on the polishing table 3, a polishing-liquid supply nozzle 10 for supplying a polishing liquid (e.g., slurry) onto the polishing pad 1, and an operation controller 12 for controlling polishing of the wafer W.

The polishing table 3 is coupled to a table motor 19 through a table shaft 3a, so that the polishing table 3 is rotated by the table motor 19 in a direction indicated by arrow. The table motor 19 is located below the polishing table 3. The polishing pad 1 is attached to an upper surface of the polishing table 3. The polishing pad 1 has an upper surface, which provides a polishing surface 1a for polishing the wafer W. The polishing head 5 is secured to a lower end of a polishing head shaft 16. The polishing head 5 is configured to be able to hold the wafer W on its lower surface by vacuum suction. The polishing head shaft 16 can be elevated and lowered by an elevating mechanism (not shown in the drawing).

Polishing of the wafer W is performed as follows. The polishing head 5 and the polishing table 3 are rotated in directions indicated by arrows, while the polishing liquid (or slurry) is supplied from the polishing-liquid supply nozzle 10 onto the polishing pad 1. In this state, the polishing head 5 presses the wafer W against the polishing surface 1a of the polishing pad 1. The surface of the wafer W is polished by a chemical action of the polishing liquid and a mechanical action of abrasive grains contained in the polishing liquid.

The polishing apparatus includes an optical film-thickness measuring device (i.e., a film-thickness measuring apparatus) 25 for measuring a film thickness of the wafer W. This optical film-thickness measuring device 25 includes a light source 30 for emitting light, an illuminating fiber 34 having distal ends 34a, 34b arranged at different locations in the polishing table 3, a light-receiving fiber 50 having distal ends 50a, 50b arranged at the different locations in the polishing table 3, a spectrometer 26 for decomposing reflected light, transmitted from the wafer W through the light-receiving fiber 50, in accordance with wavelength and measuring an intensity of the reflected light at each of wavelengths, and a processor 27 for producing a spectral waveform indicating a relationship between the intensity and the wavelength of the reflected light. The processor 27 is coupled to the operation controller 12. The processor 27 and the operation controller 12 are each composed of dedicated or general-purpose computers. The processor 27 and the operation controller 12 may be composed of a single computer.

The illuminating fiber 34 is coupled to the light source 30 and is arranged so as to direct the light, emitted by the light source 30, to the surface of the wafer W. The light-receiving fiber 50 is coupled to the spectrometer 26, and arranged so as to transmit the reflected light from the surface of the wafer W to the spectrometer 26. The light source 30 includes an illuminator, such as a halogen lamp or a xenon lamp.

The distal end 34a of the illuminating fiber 34 and the distal end 50a of the light-receiving fiber 50 are adjacent to each other. These distal ends 34a, 50a constitute a first sensor head 61. The other distal end 34b of the illuminating fiber 34 and the other distal end 50b of the light-receiving fiber 50 are adjacent to each other. These distal ends 34b, 50b constitute a second sensor head 62. The polishing pad 1 has through-holes 1b, 1c located above the first sensor head 61 and the second sensor head 62, respectively. The first sensor head 61 and the second sensor head 62 can transmit the light to the wafer W on the polishing pad 1 through the through-holes 1b, 1c and can receive the reflected light from the wafer W through the through-holes 1b, 1c.

In one embodiment, the illuminating fiber 34 may have only one distal end arranged at a predetermined location in the polishing table 3, and the light-receiving fiber 50 may also have only one distal end arranged at the predetermined location in the polishing table 3. In this case also, the distal end of the illuminating fiber 34 and the distal end of the light-receiving fiber 50 are adjacent to each other. The distal end of the illuminating fiber 34 and the distal end of the light-receiving fiber 50 constitute a sensor head for transmitting the light to the wafer W on the polishing pad 1, and receiving the reflected light from the wafer W.

Figure 2:
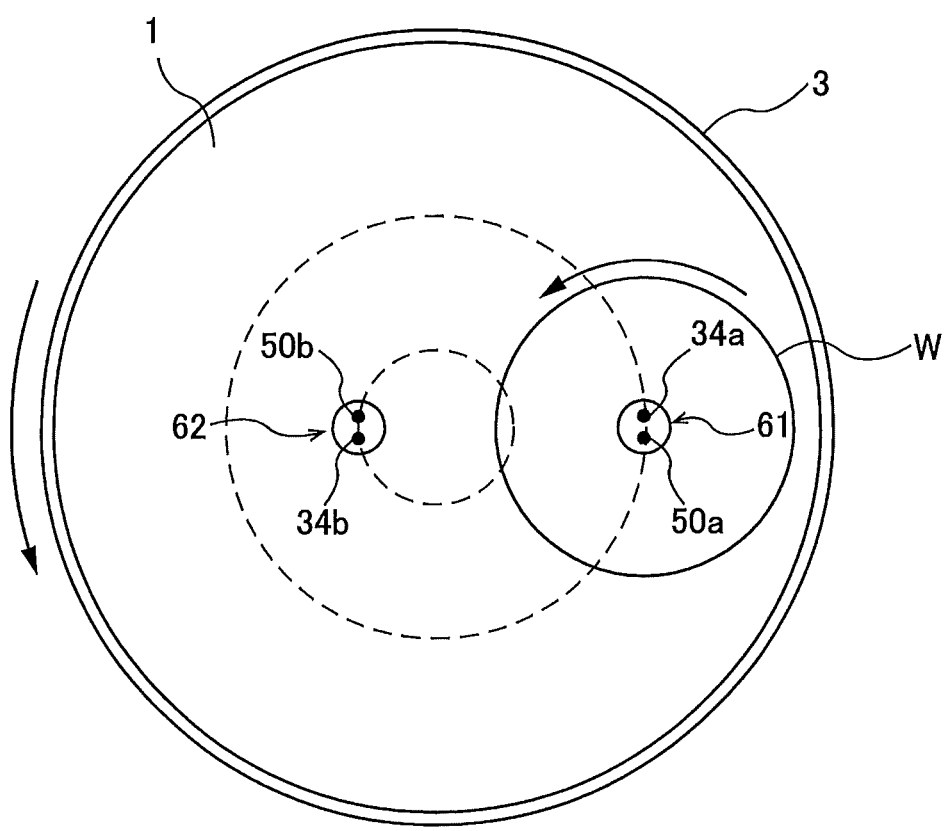
FIG. 2 is a top view showing a polishing pad and a polishing table.

FIG. 2 is a plan view showing the polishing pad 1 and the polishing table 3. The first sensor head 61 and the second sensor head 62 are located at different distances from a center of the polishing table 3, and are arranged away from each other in the circumferential direction of the polishing table 3. In the embodiment shown in FIG. 2, the second sensor head 62 is located across the center of the polishing table 3 from the first sensor head 61. The first sensor head 61 and the second sensor head 62 move across the wafer W alternately in different paths each time the polishing table 3 makes one revolution. More specifically, the first sensor head 61 sweeps across the center of the wafer W, while the second sensor head 62 sweeps across only the edge portion of the wafer W. The first sensor head 61 and the second sensor head 62 direct the light to the wafer W alternately, and receive the reflected light from the wafer W alternately.

During polishing of the wafer W, the illuminating fiber 34 directs the light to the wafer W, and the light-receiving fiber 50 receives the reflected light from the wafer W. The reflected light from the wafer W is transmitted through the light-receiving fiber 50 to the spectrometer 26. The spectrometer 26 decomposes the reflected light in accordance with wavelength, measures the intensity of the reflected light at each of the wavelengths over a predetermined wavelength range, and transmits light intensity data obtained to the processor 27. This light intensity data is an optical signal reflecting a film thickness of the wafer W, and contains the intensities of the reflected light and the corresponding wavelengths. The processor 27 produces, from the light intensity data, the spectral waveform representing the intensity of the light at each of the wavelengths.

Figure 3:
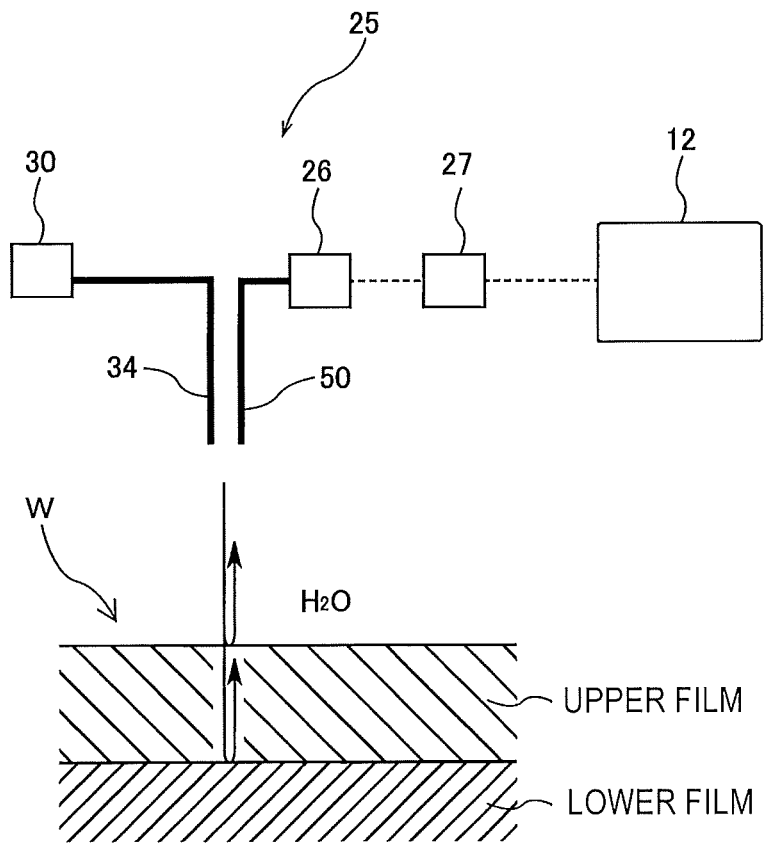
FIG. 3 is a schematic view for explaining the principle of an optical film-thickness measuring device.

FIG. 3 is a schematic view illustrating the principle of the optical film-thickness measuring device 25. In this example shown in FIG. 3, a wafer W has a lower film and an upper film formed on the lower film. The upper film is a film that can allow light to pass therethrough, such as a silicon layer or a dielectric film The light, directed to the wafer W, is reflected off an interface between a medium (e.g., water in the example of FIG. 3) and the upper film and an interface between the upper film and the lower film. Light waves from these interfaces interfere with each other. The manner of interference between the light waves varies according to the thickness of the upper film (i.e., a length of an optical path). As a result, the spectral waveform, produced from the reflected light from the wafer W, varies according to the thickness of the upper film.

The spectrometer 26 decomposes the reflected light in accordance with the wavelength and measures the intensity of the reflected light at each of the wavelengths. The processor 27 produces the spectral waveform from the reflected-light intensity data (or optical signal) obtained by the spectrometer 26. This spectral waveform is expressed as a line graph indicating a relationship between the wavelength and the intensity of the light. The intensity of the light can also be expressed as a relative value, such as a relative reflectance which will be discussed later.

Figure 4:
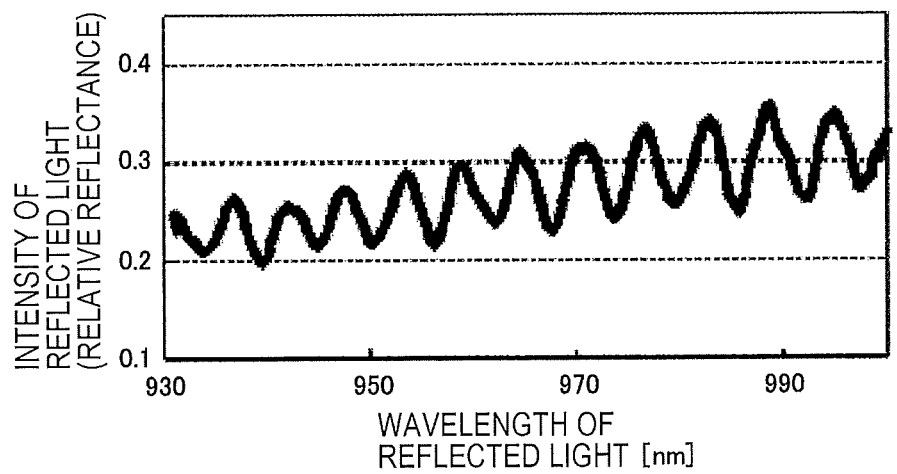
FIG. 4 is a graph showing an example of a spectral waveform.

FIG. 4 is a graph showing an example of the spectral waveform. In FIG. 4, vertical axis represents relative reflectance indicating the intensity of the reflected light from the wafer W, and horizontal axis represents wavelength of the reflected light. The relative reflectance is an index value that represents the intensity of the reflected light. The relative reflectance is a ratio of the intensity of the light to a predetermined reference intensity. By dividing the intensity of the light (i.e., the actually measured intensity) at each wavelength by a predetermined reference intensity, unwanted noises, such as a variation in the intensity inherent in an optical system or the light source of the apparatus, are removed from the actually measured intensity.

The reference intensity is an intensity that has been measured in advance at each of the wavelengths. The relative reflectance is calculated at each of the wavelengths. Specifically, the relative reflectance is determined by dividing the intensity of the light (the actually measured intensity) at each wavelength by the corresponding reference intensity. The reference intensity is, for example, obtained by directly measuring the intensity of light emitted from the first sensor head 61 or the second sensor head 62, or by irradiating a mirror with light from the first sensor head 61 or the second sensor head 62 and measuring the intensity of reflected light from the mirror. Alternatively, the reference intensity may be an intensity of the reflected light which is measured by the spectrometer 26 when a silicon wafer (bare wafer) with no film thereon is being water-polished in the presence of water, or when the silicon wafer (bare wafer) is placed on the polishing pad 1. In the actual polishing process, a dark level (which is a background intensity obtained under the condition that light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. Specifically, the relative reflectance $R(\lambda)$ can be calculated by using the following formula (1)

$$R(\lambda) = \frac{E(\lambda) - D(\lambda)}{B(\lambda) - D(\lambda)} \qquad (1)$$

where λ is wavelength, E(λ) is the intensity of the light reflected from the wafer at the wavelength λ, B(λ) is the reference intensity at the wavelength λ, and D(λ) is the background intensity (i.e., dark level) at the wavelength λ obtained under the condition that light is cut off.

Figure 5:
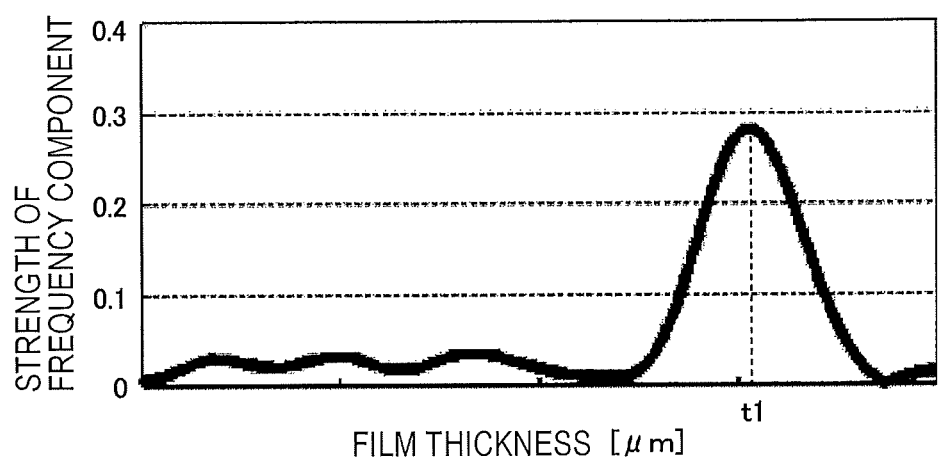
FIG. 5 is a graph showing a frequency spectrum obtained by performing a Fourier transformation process on the spectral waveform shown in FIG. 4.

The processor 27 performs a Fourier transform process (e.g., fast Fourier transform process) on the spectral waveform to produce a frequency spectrum and determines a film thickness of the wafer W from the frequency spectrum. FIG. 5 is a graph showing the frequency spectrum obtained by performing the Fourier transform process on the spectral waveform shown in FIG. 4. In FIG. 5, vertical axis represents strength of a frequency component contained in the spectral waveform, and horizontal axis represents film thickness. The strength of a frequency component corresponds to amplitude of a frequency component which is expressed as sine wave. A frequency component contained in the spectral waveform is converted into a film thickness with use of a predetermined relational expression, so that the frequency spectrum as shown in FIG. 5 is produced. This frequency spectrum represents a relationship between the film thickness and the strength of the frequency component. The above-mentioned predetermined relational expression is a linear function representing the film thickness and having the frequency component as variable. This linear function can be obtained from actual measurement results of film thickness, an optical film-thickness measurement simulation, theoretical formula, etc.

In the graph shown in FIG. 5, a peak of the strength of the frequency component appears at a film thickness t1. In other words, the strength of the frequency component becomes maximum at the film thickness of t1. Specifically, this frequency spectrum indicates that the film thickness is t1. In this manner, the processor 27 determines the film thickness corresponding to a peak of the strength of the frequency component.

The processor 27 outputs the film thickness t1 as a film-thickness measurement value to the operation controller 12. The operation controller 12 controls polishing operations (e.g., a polishing terminating operation) based on the film thickness t1 sent from the processor 27. For example, when the film thickness t1 has reached a preset target value, the operation controller 12 terminates polishing of the wafer W.

Figure 6:
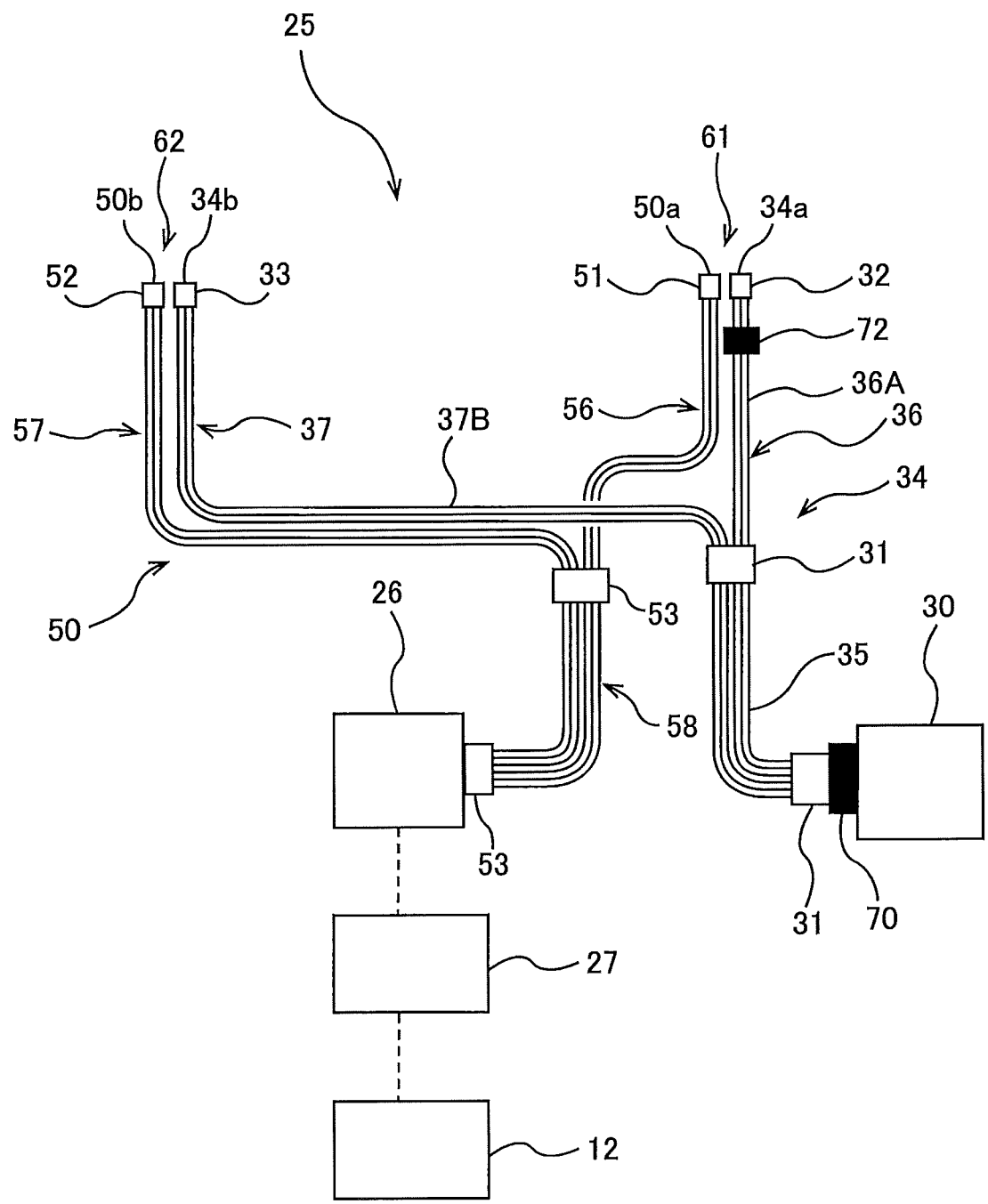
FIG. 6 is an enlarged view showing an embodiment of the optical film-thickness measuring device (film-thickness measuring apparatus)

FIG. 6 is an enlarged view showing an embodiment of the optical film-thickness measuring device (i.e., the film-thickness measuring apparatus) 25. The illuminating fiber 34 includes a first illuminating fiber 36 and a second illuminating fiber 37. Each of the first illuminating fiber 36 and the second illuminating fiber 37 is composed of a plurality of strand optical fibers. End portions of the strand optical fibers, constituting the first illuminating fiber 36, are bound by a binder 32. Likewise, end portions of the plurality of strand optical fibers, constituting the second illuminating fiber 37, are bound by a binder 33. One ends of the first illuminating fiber 36 and the second illuminating fiber 37 are coupled to the light source 30, and other ends of the first illuminating fiber 36 and the second illuminating fiber 37 constitute the distal ends 34a, 34b of the illuminating fiber 34.

A part of the first illuminating fiber 36 and a part of the second illuminating fiber 37 are bound by a binder 31 to constitute a trunk optical fiber 35. The other part of the first illuminating fiber 36 and the other part of the second illuminating fiber 37 constitute a first branch optical fiber 36A and a second branch optical fiber 37B, respectively, which branch off from the trunk optical fiber 35. Distal ends of the branch optical fibers 36A, 37B constitute the distal ends 34a, 34b of the illuminating fiber 34. In the following descriptions, the distal end of the branch optical fiber 36A may be referred to as distal end 34a, and the distal end of the branch optical fiber 37B may be referred to as distal end 34b.

The end of the trunk optical fiber 35 (i.e., light-source-side ends of the first illuminating fiber 36 and the second illuminating fiber 37) is coupled to the light source 30 via a first dimmer 70. The first dimmer 70 has a function of regulating a quantity of light emitted from the light source 30, i.e., reducing the quantity of light. The first dimmer 70 is attached to the trunk optical fiber 35. Specifically, the first dimmer 70 is attached to both the first illuminating fiber 36 and the second illuminating fiber 37.

In the present embodiment, the end of the trunk optical fiber 35 is coupled to the first dimmer 70, and the first dimmer 70 is fixed to the light source 30. In one embodiment, the first dimmer 70 may be incorporated in the trunk optical fiber 35. Specifically, the trunk optical fiber 35 may have an upstream-side trunk optical fiber and a downstream-side trunk optical fiber aligned in a straight line, and the first dimmer 70 may be disposed between the upstream-side trunk optical fiber and the downstream-side trunk optical fiber.

In the embodiment shown in FIG. 6, two branch optical fibers 36A, 37B branch off from one trunk optical fiber 35. Three or more branch optical fibers can branch off by adding strand optical fibers. Further, a diameter of the fiber can be easily increased by adding strand optical fibers. Such an optical fiber constituted by the plurality of strand optical fibers has advantages that it can be easily bent and is not easily broken.

The light-receiving fiber 50 includes a first light-receiving fiber 56 and a second light-receiving fiber 57. Each of the first light-receiving fiber 56 and the second light-receiving fiber 57 is composed of a plurality of strand optical fibers. Ends of the strand optical fibers, constituting the first light-receiving fiber 56, are bound by a binder 51. Likewise, ends of the strand optical fibers, constituting the second light-receiving fiber 57, are bound by the binder 52. The distal ends 50a, 50b of the light-receiving fiber 50 are constituted by the distal ends of the first light-receiving fiber 56 and the second light-receiving fiber 57, respectively.

The distal end 34a of the first branch optical fiber 36A and the distal end 50a of the first light-receiving fiber 56 constitute the first sensor head 61. The distal end 34b of the second branch optical fiber 37B and the distal end 50b of the second light-receiving fiber 57 constitute the second sensor head 62. A part of the first light-receiving fiber 56 and a part of the second light-receiving fiber 57 are bound by the binder 53 to constitute a trunk optical fiber 58. The other part of the first light-receiving fiber 56 and the other part of the second light-receiving fiber 57 constitute branch optical fibers branching off from the trunk optical fiber 58. The trunk optical fiber 58 is coupled to the spectrometer 26. The spectrometer 26 is electrically connected to the processor 27.

In the present embodiment, the first light-receiving fiber 56 and the second light-receiving fiber 57, constituting the light-receiving fiber 50, are coupled to the spectrometer 26. During polishing of the wafer W, the light is transmitted to the spectrometer 26 through both the first light-receiving fiber 56 and the second light-receiving fiber 57. Since the intensity of light, other than the light reflected from the wafer W, is extremely low, accurate measuring of a film thickness is possible by using only the light having the intensity above a threshold value for measuring of a film thickness. In one embodiment, an optical switch, which selectively connects either the first light-receiving fiber 56 or the second light-receiving fiber 57 to the spectrometer 26, may be disposed between the light-receiving fibers 56, 57 and the spectrometer 26.

In the present embodiment, the second dimmer 72 is attached to the first branch optical fiber 36A (i.e., the first light illuminating fiber 36). The second dimmer 72 has a function of regulating the quantity of light transmitted through the first branch optical fiber 36A, i.e., reducing the quantity of light. The first dimmer 70 and the second dimmer 72 have the same configuration.

Figure 7:
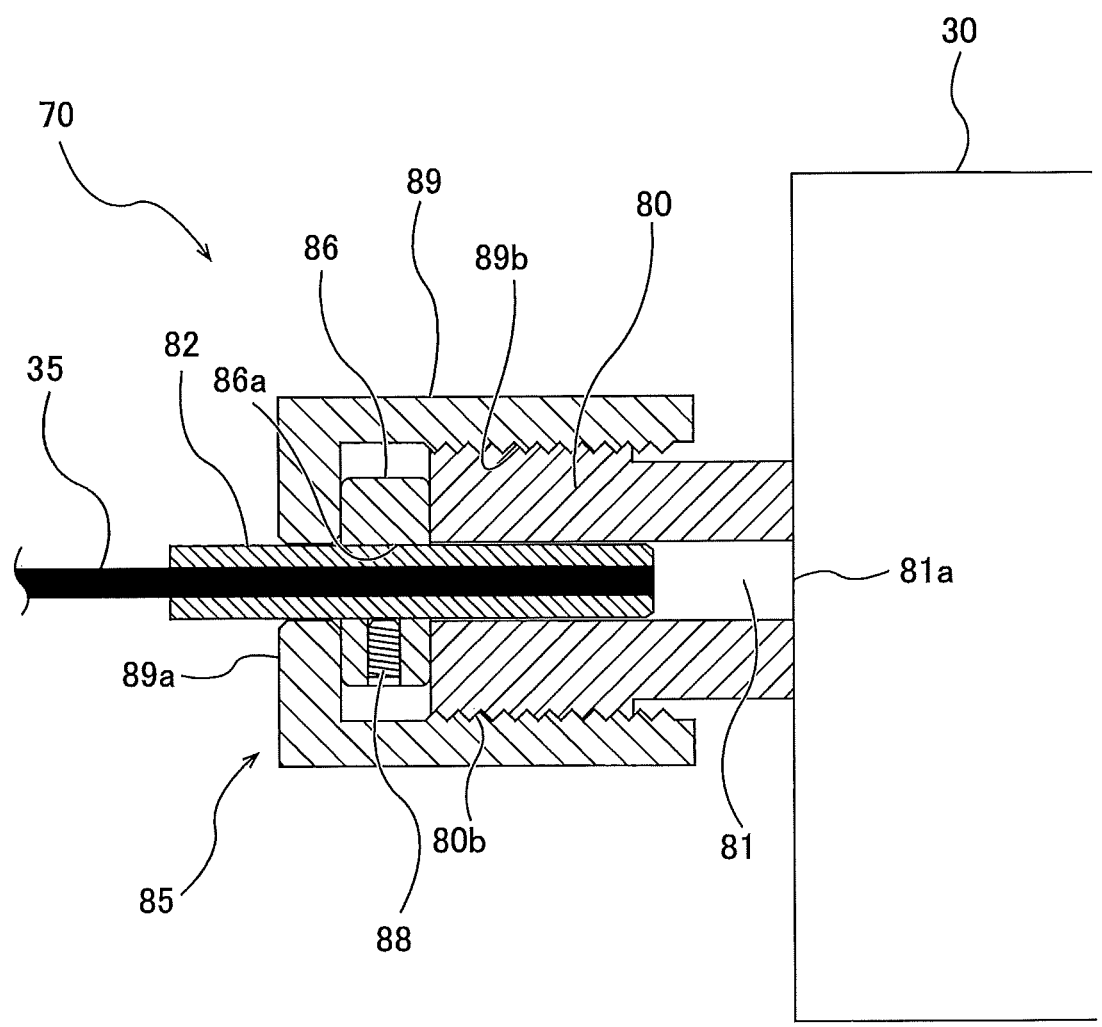
FIG. 7 is a schematic view showing an embodiment of a structure of a first dimmer.

FIG. 7 is a schematic diagram showing one embodiment of the configuration of the first dimmer 70. The first dimmer 70 includes a base member 80 having an light passage 81 formed therein, an optical-fiber holder 82 inserted in the light passage 81, and a relative-position adjusting mechanism 85 configured to adjust a position of the optical-fiber holder 82 relative to the base member 80. The relative-position adjusting mechanism 85 includes a flange 86 having a through-hole 86a into which the optical-fiber holder 82 is inserted, a set screw 88 screwed into the flange 86, and a cap nut 89 for fixing the flange 86 to the base member 80. It should be noted that the relative-position adjusting mechanism 85 is not limited to this embodiment as long as the relative-position adjusting mechanism 85 is configured to be capable of adjusting the relative position of the optical-fiber holder 82 with respect to the base member 80.

The trunk optical fiber 35, composed of the first illuminating fiber 36 and the second illuminating fiber 37, is fixed to the optical-fiber holder 82, with an end portion of the trunk optical fiber 35 exposed in the light passage 81. The width of the optical-fiber holder 82 is smaller than the width of the light passage 81, so that the optical-fiber holder 82 is movable in the light passage 81 in its longitudinal direction. The set screw 88 penetrates the flange 86 in its radial direction. The width of the through-hole 86a of the flange 86 is larger than the width of the optical-fiber holder 82, so that the flange 86 is movable relative to the optical-fiber holder 82 in the longitudinal direction of the optical-fiber holder 82. A distal end of the set screw 88 is located in the through-hole 86a of the flange 86, and is in contact with an outer surface of the optical-fiber holder 82. The flange 86 has a width larger than the width of the light passage 81. When the set screw 88 is tightened, with the optical-fiber holder 82 inserted in the through-hole 86a of the flange 86, the flange 86 is fixed to the optical-fiber holder 82.

The optical-fiber holder 82 extends through the cap nut 89. The cap nut 89 has a head portion 89a that protrudes inwardly. The flange 86 is disposed between the head portion 89a of the cap nut 89 and an end face of the base member 80. The base member 80 has a cylindrical shape. A screw thread 80b is formed on an outer circumferential surface of the base member 80, and a screw thread 89b is formed on an inner circumferential surface of the cap nut 89. The screw thread 89b of the cap nut 89 is engaged with the screw thread 80b of the base member 80. When the cap nut 89 is tightened, the flange 86 is pressed against the base member 80 by the cap nut 89, whereby the flange 86 is fixed to the base member 80. Since the optical-fiber holder 82 is fixed to the flange 86 by the set screw 88, the position of the optical-fiber holder 82 relative to the base member 80 is fixed.

The trunk optical fiber 35 is fixed to the optical-fiber holder 82. The optical-fiber holder 82 and the trunk optical fiber 35 are movable together. The relative position of the optical-fiber holder 82 with respect to the base member 80 is variable. Specifically, when the cap nut 89 is removed from the base member 80 and the set screw 88 is loosened, it is possible to move the optical-fiber holder 82 relative to the base member 80 while the distal end of the optical-fiber holder 82 is located in the light passage 81. Thereafter, the set screw 88 is tightened, and the cap nut 89 is fastened to the base member 80. As a result, the relative position of the optical-fiber holder 82 with respect to the base member 80 is fixed. Since the trunk optical fiber 35 is fixed to the optical-fiber holder 82, it is possible to adjust the position of the trunk optical fiber 35 relative to the light passage 81 by adjusting the position of the optical-fiber holder 82 relative to the base member 80.

The light emitted from the light source 30 travels through the light passage 81 and reaches the trunk optical fiber 35 held by the optical-fiber holder 82. The quantity of light reaching the trunk optical fiber 35, i.e., the quantity of light transmitted through the trunk optical fiber 35, can be adjusted by the position of the optical-fiber holder 82 relative to the base member 80. Specifically, when the optical-fiber holder 82 is moved in a direction as to decrease a distance from an entrance 81a of the light passage 81 to the optical-fiber holder 82, the quantity of light reaching the trunk optical fiber 35 increases. On the other hand, when the optical-fiber holder 82 is moved in a direction as to increase the distance from the entrance 81a of the light passage 81 to the optical-fiber holder 82, the quantity of light reaching the trunk optical fiber 35 decreases. The position of the optical-fiber holder 82 can be freely adjusted by the flange 86 and the set screw 88. Therefore, the first dimmer 70 can finely regulate the quantity of light transmitted through the trunk optical fiber 35.

Figure 8:
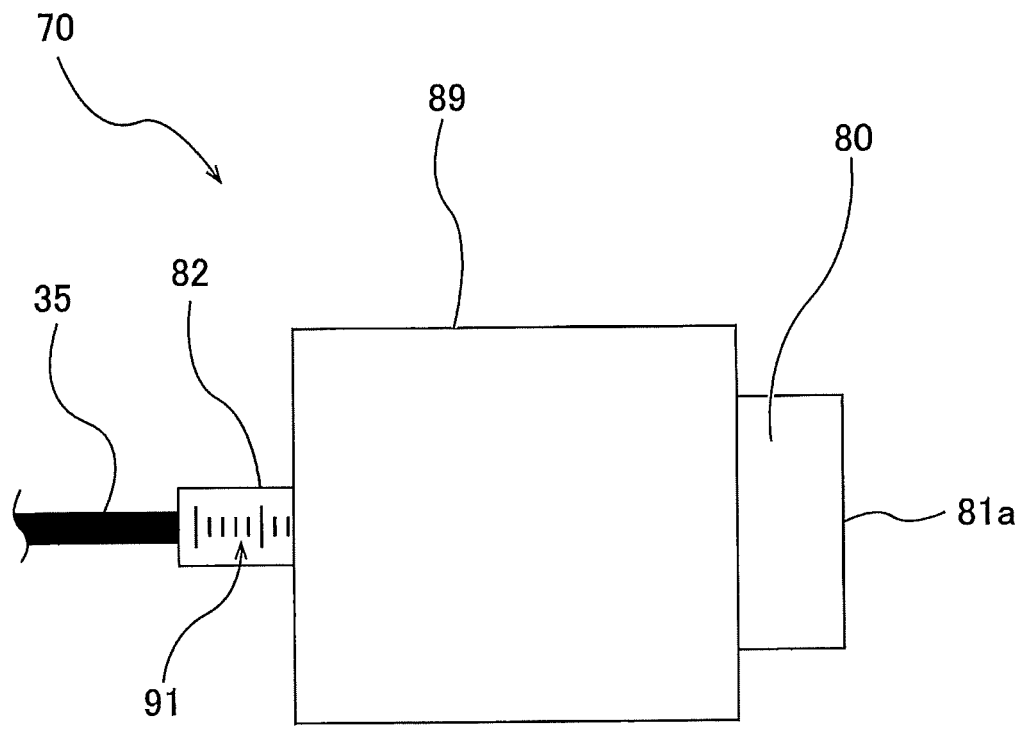
FIG. 8 is a diagram showing an appearance of the first dimmer.

FIG. 8 is a diagram showing an appearance of the first dimmer 70. As shown in FIG. 8, the optical-fiber holder 82 has a scale 91 on its outer surface. This scale 91 makes it easy to adjust the relative position of the optical-fiber holder 82 with respect to the base member 80.

In this manner, the adjustment of the relative position of the optical-fiber holder 82 with respect to the base member 80 allows for the adjustment of the quantity of light transmitted through the trunk optical fiber 35. Therefore, the quantity of light directed from the light source 30 to the wafer W can be adjusted by the first dimmer 70. The second dimmer 72, attached to the first branch optical fiber 36A, also has the same configuration as the first dimmer 70. Therefore, the second dimmer 72 can similarly adjust the quantity of light transmitted through the first branch optical fiber 36A.

In the present embodiment, the base member 80 is fixed to the light source 30. In one embodiment, the base member 80 may be fixed to the trunk optical fiber 35 as well as the optical-fiber holder 82. Specifically, the trunk optical fiber 35 has an upstream-side trunk optical fiber and a downstream-side trunk optical fiber aligned in a straight line, the base member 80 is fixed to the upstream-side trunk optical fiber, and the optical-fiber holder 82 is fixed to the downstream-side trunk optical fiber.

The first dimmer 70 is attached to both the first illuminating fiber 36 and the second illuminating fiber 37. Accordingly, the first dimmer 70 is used to reduce the total quantity of light emitted from the light source 30. The reasons are as follows. If the quantity of reflected light, exceeding an effective measuring range of the spectrometer 26, is directed to the spectrometer 26, the spectrometer 26 cannot correctly measure the intensity of the reflected light at each wavelength. Therefore, the total quantity of light emitted from the light source 30 is reduced by the first dimmer 70 so that the quantity of reflected light from the wafer W falls within the effective measuring range of the spectrometer 26. By appropriately reducing the quantity of light by the first dimmer 70, the spectrometer 26 can correctly measure the intensity of the reflected light. As a result, the film thickness of the wafer W can be accurately measured.

Figure 9:
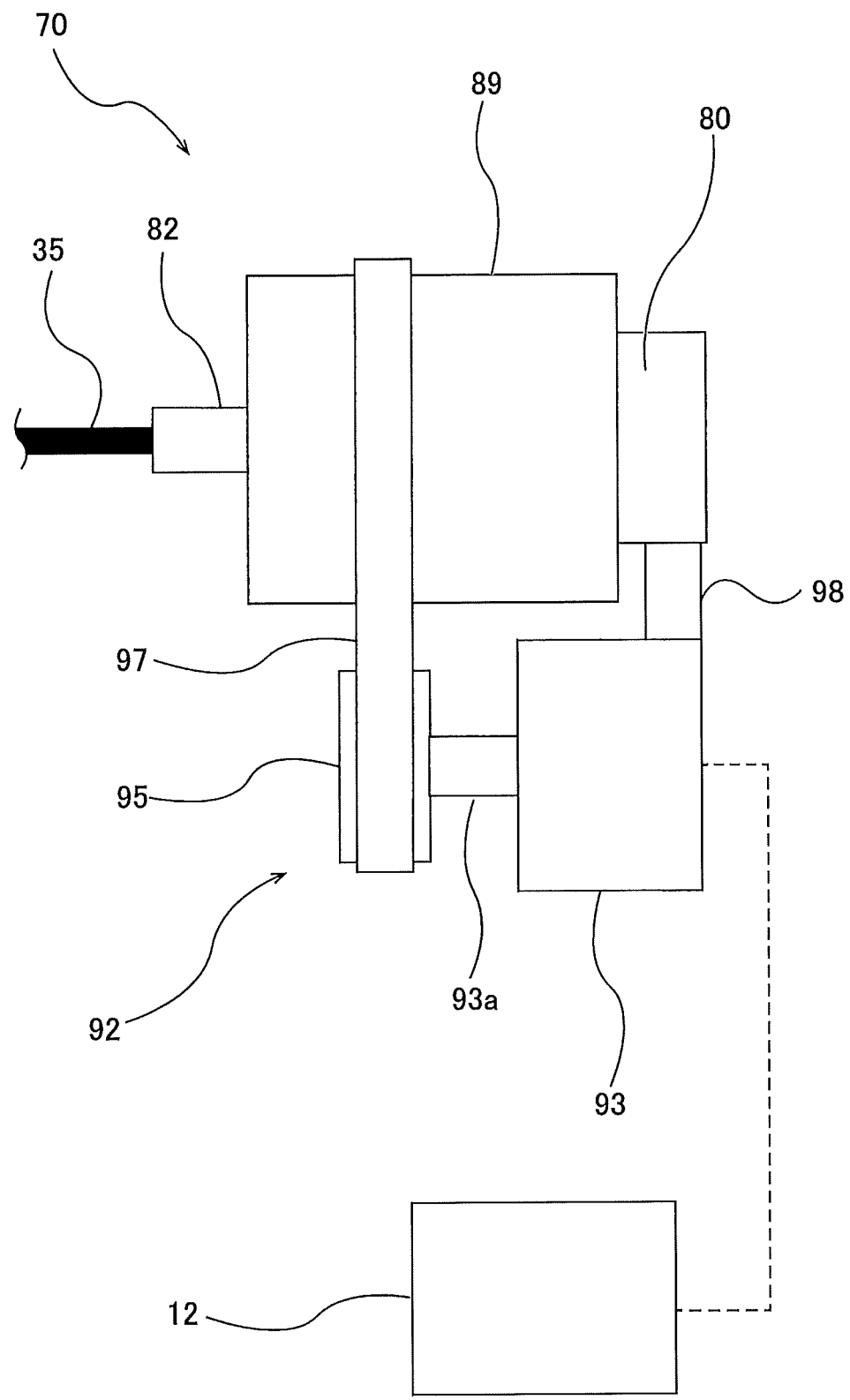
FIG. 9 is a view showing another embodiment of a relative-position adjusting mechanism.

FIG. 9 is a view showing another embodiment of the relative-position adjusting mechanism 85. The relative-position adjusting mechanism 85 includes a motor-driven moving mechanism 92 for moving the optical-fiber holder 82 relative to the base member 80. The motor-driven moving mechanism 92 includes an electric motor 93 fixed to the base member 80, a pulley 95 fixed to a rotational shaft 93a of the electric motor 93, and a belt 97 riding on the pulley 95 and an outer circumferential surface of the cap nut 89.

The pulley 95 can receive a torque of the rotational shaft 93a, while the pulley 95 is configured to be movable relative to the rotational shaft 93a in the axial direction of the rotational shaft 93a. For example, the pulley 95 and the rotational shaft 93a may be coupled by an engagement of a key and a keyway, or may be coupled by a ball spline bearing. A servo motor or a stepping motor is used as the electric motor 93. The electric motor 93 is fixed to the base member 80 through a coupling member 98. When the electric motor 93 is in motion, the torque of the electric motor 93 is transmitted to the cap nut 89 through the pulley 95 and the belt 97, thereby rotating the cap nut 89.

Figure 10:
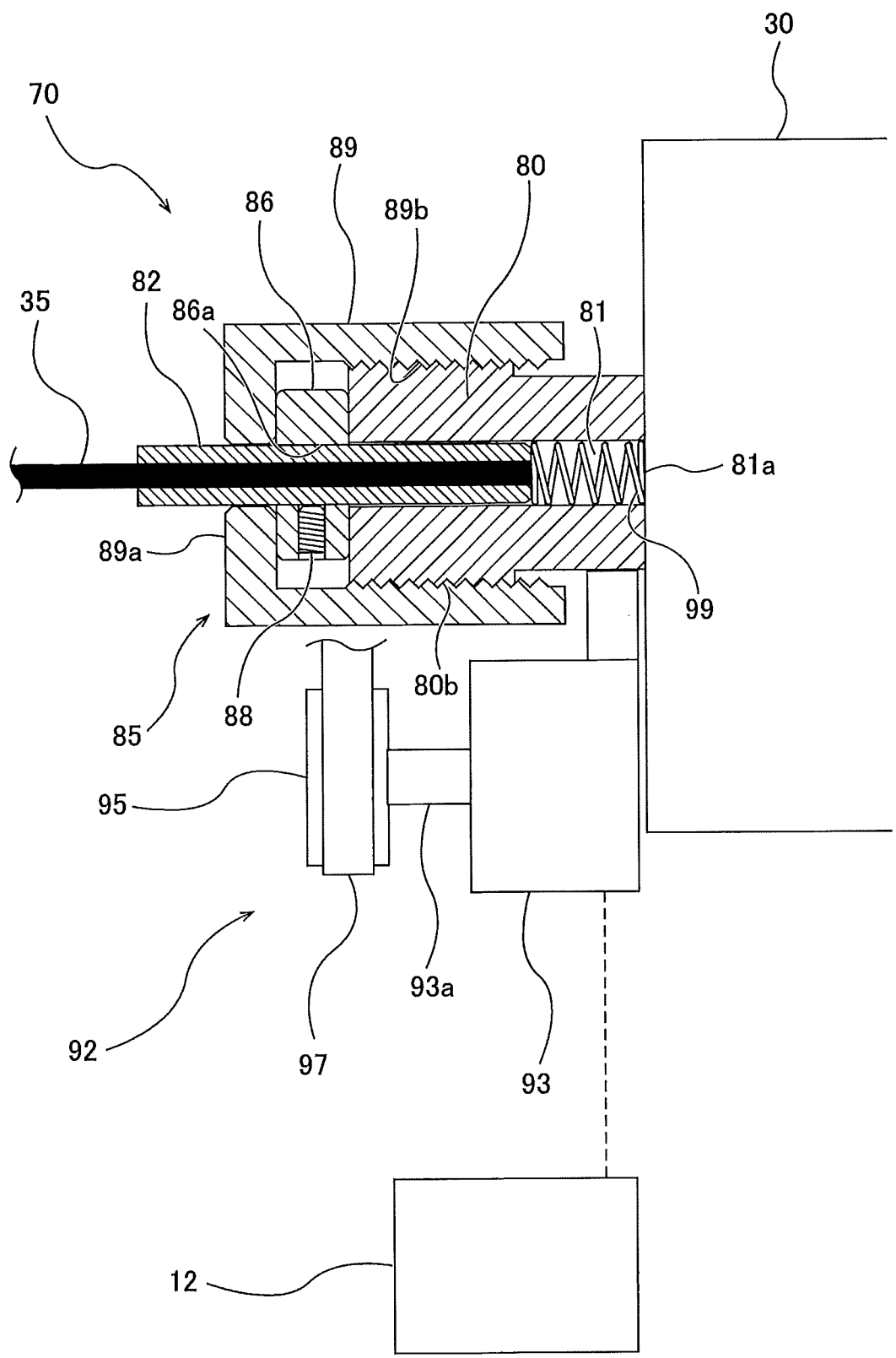
FIG. 10 is a cross-sectional view showing a structure of the first dimmer shown in FIG. 9.

FIG. 10 is a cross-sectional view showing the structure of the first dimmer 70 shown in FIG. 9. Structures of the first dimmer 70 shown in FIG. 10, which are not specifically described, are the same as those of the first dimmer 70 shown in FIG. 7, duplicate descriptions are omitted. The motor-driven moving mechanism 92 further includes a spring 99 arranged in the light passage 81. One end of the spring 99 is in contact with the end of the optical-fiber holder 82 such that the spring 99 forces the optical-fiber holder 82 and the trunk optical fiber 35 in a direction away from the entrance 81a of the light passage 81.

When the electric motor 93 rotates the cap nut 89 in a direction as to loosen the cap nut 89 with the set screw 88 tightened, the spring 99 moves the optical-fiber holder 82 and the trunk optical fiber 35 in the direction away from the entrance 81a of the light passage 81. When the electric motor 93 rotates the cap nut 89 in a direction as to tighten the cap nut 89, the cap nut 89 moves the optical-fiber holder 82 and the trunk optical fiber 35 in the direction toward the entrance 81a of the light passage 81 against the repulsive force of the spring 99. In this manner, the distance between the optical-fiber holder 82 and the entrance 81a of the light passage 81 is changed by the operation of the electric motor 93, and as a result, the quantity of light reaching the trunk optical fiber 35 changes.

The motor-driven moving mechanism 92 is coupled to the operation controller 12. The operation of the motor-driven moving mechanism 92 is controlled by the operation controller 12. The operation controller 12 is configured to operate the motor-driven moving mechanism 92 until the quantity of light, emitted from the illuminating fiber 34, reaches a target value. Specifically, a not-shown reflector (e.g., a wafer, a dummy wafer, or a mirror) is placed on the polishing surface 1a of the polishing pad 1, the light is directed from the first illuminating fiber 36 or the second illuminating fiber 37 to the reflector, the intensity of the reflected light from the reflector is measured by the spectrometer 26, and the operation controller 12 operates the electric motor 93 of the motor-driven moving mechanism 92 until the measured intensity of the reflected light reaches a set value corresponding to the above-mentioned target value.

Figure 11:
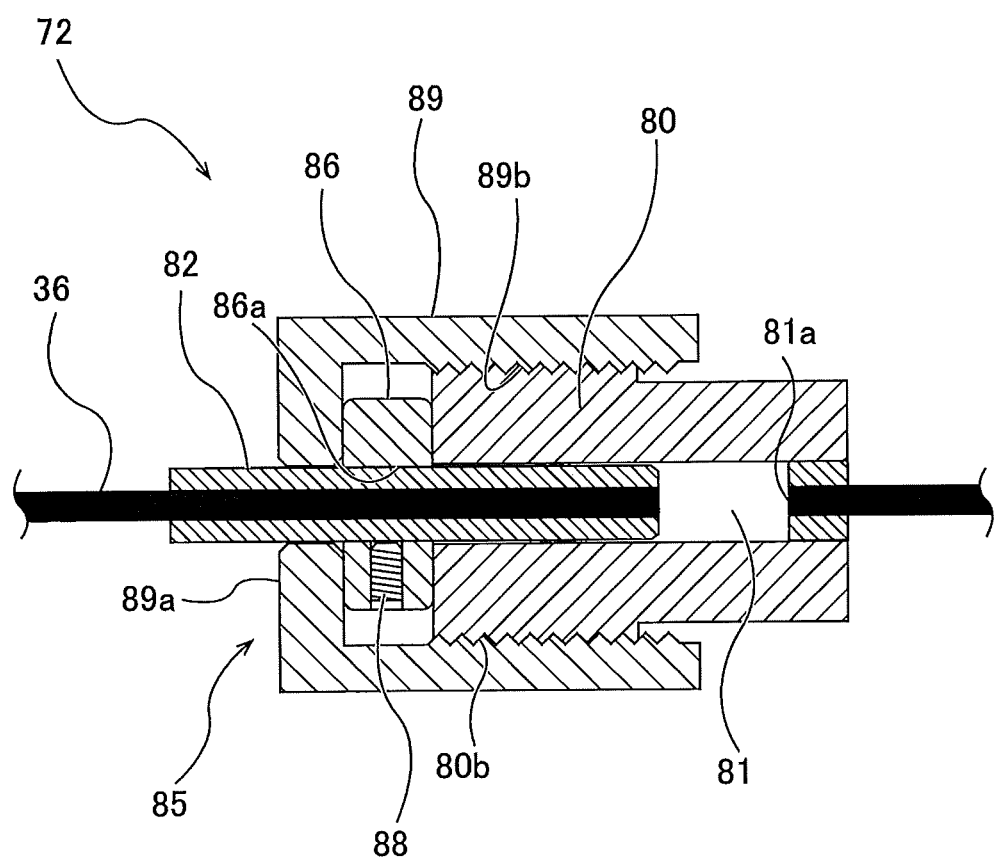
FIG. 11 is a schematic view showing an embodiment of a structure of a second dimmer.

FIG. 11 is a schematic diagram showing an embodiment of the configuration of the second dimmer 72. Since the second dimmer 72 has basically the same structure as the first dimmer 70, the same reference numerals denote the same elements as those of the first dimmer 70, and the second dimmer 72 will not be described in detail. As shown in FIG. 11, the second dimmer 72 is attached to the first illuminating fiber 36, i.e., the first branch optical fiber 36A. The second dimmer 72 is used to balance the quantities of light directed from the first illuminating fiber 36 and the second illuminating fiber 37 to the wafer W. More specifically, the second dimmer 72 reduces the quantity of light transmitted through the first illuminating fiber 36 (i.e., the first branch optical fiber 36A) such that the quantities of light directed from the first illuminating fiber 36 and the second illuminating fiber 37 to the wafer W are the same. As a result, the first sensor head 61 and the second sensor head 62 can measure the film thickness of the wafer W under the same optical conditions.

When the quantity of light directed from the second light illuminating fiber 37 to the wafer W is larger than the quantity of light directed from the first light illuminating fiber 36 to the wafer W, the second dimmer 72 is attached to the second light illuminating fiber 37 (i.e., the second branch optical fiber 37B). In this case also, the quantity of light transmitted through the second light illuminating fiber 37 is regulated by the second dimmer 72 such that the quantities of light directed from the first light illuminating fiber 36 and the second light illuminating fiber 37 to the wafer W are the same.

The motor-driven moving mechanism 92 shown in FIGS. 9 and 10 can also be applied to the second dimmer 72 shown in FIG. 11. The operation controller 12 is configured to operate the motor-driven moving mechanism 92 until the quantities of light emitted from the first illuminating fiber 36 and the second illuminating fiber 37 becomes equal to each other. In the case where the second dimmer 72 is attached to the first illuminating fiber 36, the quantity of light is regulated in the following manner. A not-shown reflector (e.g., a wafer, a dummy wafer, or a mirror) is placed on the polishing surface 1a of the polishing pad 1 so as to face the distal end 34b of the second illuminating fiber 37. The light is directed from the second illuminating fiber 37 to the reflector, and the intensity of the reflected light from the reflector is measured by the spectrometer 26, whereby a reference value is obtained. The reflector is placed on the polishing surface 1a of the polishing pad 1 so as to face the distal end 34a of the first illuminating fiber 36. The light is directed from the first illuminating fiber 36 to the reflector, and the intensity of the reflected light from the reflector is measured by the spectrometer 26. The operation controller 12 operates the electric motor 93 of the motor-driven moving mechanism 92 until the measured intensity of the reflected light becomes equal to the reference value.

Similarly, in the case where the second dimmer 72 is attached to the second illuminating fiber 37 instead of the first illuminating fiber 36, the quantity of light is adjusted in the same manner. Specifically, the reflector is placed on the polishing surface 1a of the polishing pad 1 so as to face the distal end 34a of the first illuminating fiber 36. The light is directed from the first illuminating fiber 36 to the reflector, and the intensity of the reflected light from the reflector is measured by the spectrometer 26, whereby a reference value is obtained. The reflector is placed on the polishing surface 1a of the polishing pad 1 so as to face the distal end 34b of the second illuminating fiber 37. The light is directed from the second illuminating fiber 37 to the reflector, and the intensity of the reflected light from the reflector is measured by the spectrometer 26. The operation controller 12 operates the electric motor 93 of the motor-driven moving mechanism 92 until the measured intensity of the reflected light becomes equal to the reference value.

Figure 12:
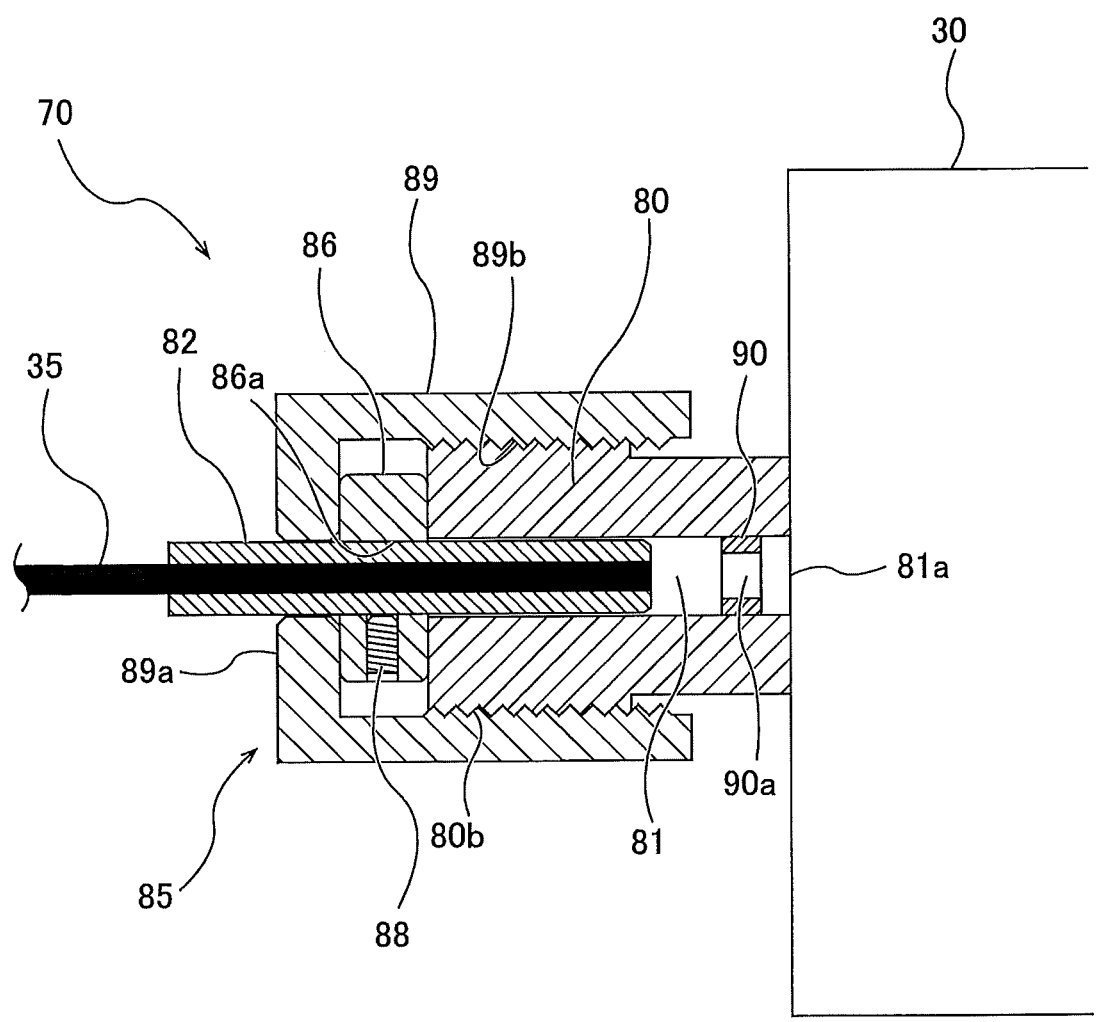
FIG. 12 is a schematic view showing another embodiment of the structure of the first dimmer.

FIG. 12 is a schematic diagram showing the configuration of another embodiment of the first dimmer 70. Structures, which are not specifically described, are the same as those shown in FIG. 7, and duplicate descriptions will be omitted. The first dimmer 70 of the present embodiment includes a diaphragm (or an aperture) 90 disposed in the light passage 81. The diaphragm 90 is a member having an opening 90a. The diaphragm 90 is removably disposed in the light passage 81. The diaphragm 90 is located between the entrance 81a of the light passage 81 and the optical-fiber holder 82. The quantity of light that can pass through the diaphragm 90 depends on the size of the opening 90a of the diaphragm 90. Therefore, the quantity of light can be adjusted by appropriately selecting a diaphragm to be used from a plurality of diaphragms having openings of different sizes.

According to the present embodiment, the quantity of light emitted from the light source 30 is reduced in two stages. Specifically, the quantity of light is first reduced by the diaphragm 90, and is further reduced according to the position of the optical-fiber holder 82 relative to the base member 80. Even when the quantity of light emitted from the light source 30 is large, the first dimmer 70 of the present embodiment can reduce the quantity of light to an appropriate level and can finely adjust the quantity of light. Although not shown in the drawings, the second dimmer 72 may also have the configuration of the embodiment shown in FIG. 12. The motor-driven moving mechanism 92 shown in FIGS. 9 and 10 can also be applied to the first dimmer 70 shown in FIG. 12.

Figure 13:
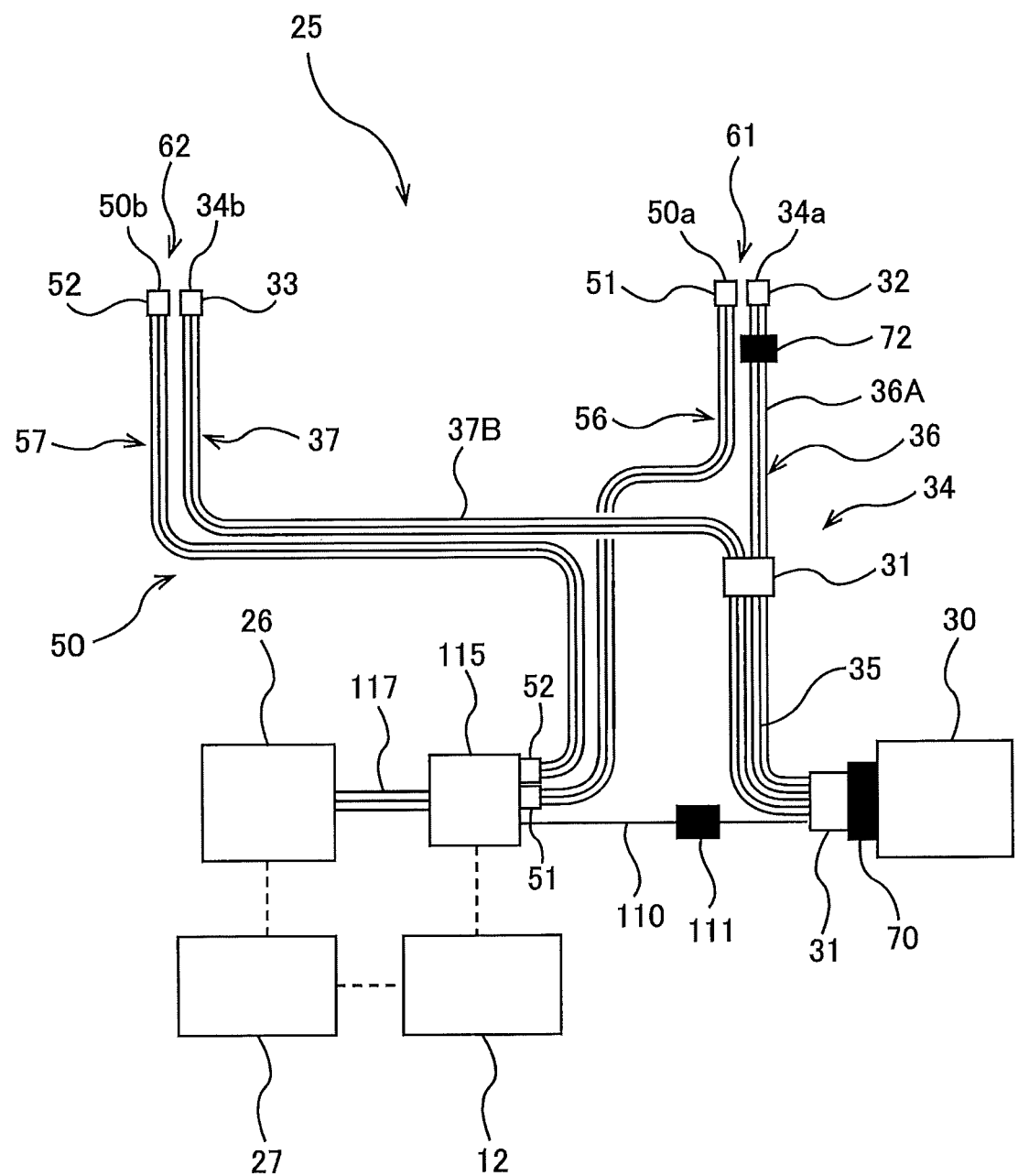
FIG. 13 is an enlarged view showing another embodiment of the optical film-thickness measuring device (film-thickness measuring apparatus)

FIG. 13 is an enlarged view showing another embodiment of the optical film-thickness measuring device (film-thickness measuring apparatus) 25. Structures, which are not specifically described, are the same as those shown in FIG. 6, and duplicate descriptions will be omitted. The optical film-thickness measuring device 25 further includes a monitoring optical fiber 110 coupled to the light source 30 and the spectrometer 26, and a third dimmer 111 attached to the monitoring optical fiber 110. One end of the monitoring optical fiber 110 is coupled to the light source 30 via the first dimmer 70, and the other end of the monitoring optical fiber 110 is coupled to the spectrometer 26 via an optical switch 115 and a connection optical fiber 117. The connection optical fiber 117 extends between the optical switch 115 and the spectrometer 26. The optical switch 115 is coupled to the spectrometer 26 through the connection optical fiber 117.

The optical switch 115 is configured to optically connect either one of the light-receiving fiber 50 or the monitoring optical fiber 110 to the spectrometer 26 through the connection optical fiber 117. More specifically, when the optical switch 115 operates to optically connect the light-receiving fiber 50 to the spectrometer 26, the reflected light from the wafer W is directed to the spectrometer 26 through the light-receiving fiber 50, the optical switch 115, and the connection optical fiber 117. When the optical switch 115 operates to optically connect the monitoring optical fiber 110 to the spectrometer 26, the light emitted from the light source 30 is directed to the spectrometer 26 through the monitoring optical fiber 110, the optical switch 115, and the connection optical fiber 117. The operation of the optical switch 115 is controlled by the operation controller 12.

A part of the first illuminating fiber 36, a part of the second illuminating fiber 37, and a part of the monitoring optical fiber 110 are bound by the binder 31 to constitute the trunk optical fiber 35. The end of the trunk optical fiber 35 (i.e., the light-source-side ends of the illuminating fiber 34 and the monitoring optical fiber 110) is coupled to the light source 30 via the first dimmer 70.

The light-receiving fiber 50 includes first light-receiving fiber 56 composed of a plurality of strand optical fibers bound by binder 51, and second light-receiving fiber 57 composed of a plurality of strand optical fibers bound by binder 52. Distal ends 50a, 50b of the light-receiving fiber 50 are constituted by distal ends of the first light-receiving fiber 56 and the second light-receiving fiber 57. The first light-receiving fiber 56 and the second light-receiving fiber 57 are coupled to the optical switch 115.

When a wafer W is to be polished, the operation controller 12 operates the optical switch 115 to optically connect the light-receiving fiber 50 to the spectrometer 26. More specifically, each time the polishing table 3 makes one revolution, the operation controller 12 operates the optical switch 115 to connect the first light-receiving fiber 56 and the second light-receiving fiber 57 alternately to the spectrometer 26. While the distal end 50a of the first light-receiving fiber 56 is under the wafer W, the first light-receiving fiber 56 is coupled to the spectrometer 26. While the distal end 50b of the second light-receiving fiber 57 is under the wafer W, the second light-receiving fiber 57 is coupled to the spectrometer 26. The optical switch 115 may be applied to the embodiment shown in FIG. 6.

In the present embodiment, the optical switch 115 is configured to optically connect one of the first light-receiving fiber 56, the second light-receiving fiber 57, and the monitoring optical fiber 110 to the spectrometer 26. In one embodiment, the optical switch 115 may be configured to optically connect either the light-receiving fibers 56, 57 or the monitoring optical fiber 110 to the spectrometer 26. In this case, while the wafer W is being polished, the light is transmitted to the spectrometer 26 through both of the light-receiving fibers 56, 57. Since the intensity of the light, other than the reflected light from the wafer W, is extremely low, accurate measuring of a film thickness is possible by using only the light having the intensity above a threshold value for measuring of a film thickness.

The third dimmer 111 is attached to the monitoring optical fiber 110. The third dimmer 111 has the same configuration as the first dimmer 70 described with reference to FIGS. 7 and 8 or the second dimmer 72 described with reference to FIG. 11, and therefore duplicate explanations will be omitted. One end of the monitoring optical fiber 110 is coupled to the light source 30 via the first dimmer 70, and the other end of the monitoring optical fiber 110 is coupled to the spectrometer 26 via the optical switch 115. The quantity of light is reduced by the first dimmer 70 and further reduced by the third dimmer 111 such that the quantity of light, emitted from the light source 30, falls within the effective measuring range of the spectrometer 26. The third dimmer 111 may have the configuration shown in FIG. 12. One end of the monitoring optical fiber 110 may be directly coupled to the light source 30 without the first dimmer 70. The motor-driven moving mechanism 92 shown in FIGS. 9 and 10 can also be applied to the third dimmer 111 shown in FIG. 13.

Generally, the emitted by the light source 30 is gradually lowered with an operating time of the light source 30. As a result, an error between a true film thickness and a measured film thickness becomes larger. Thus, in this embodiment, the optical film-thickness measuring device 25 is configured to correct the intensity of the reflected light from the wafer W based on the intensity of light transmitted to the spectrometer 26 through the monitoring optical fiber 110, and compensate for the decrease in the quantity of light of the light source 30.

The processor 27 calculates a corrected intensity of the reflected light with use of the following correction formula (2), instead of the aforementioned formula (1).

$$R'(\lambda) = [E(\lambda) - D3(\lambda)] \Big/ \left[ [B(\lambda) - D1(\lambda)] \times \frac{G(\lambda) - D3(\lambda)}{F(\lambda) - D2(\lambda)} \right] \quad (2)$$

where $R'(\lambda)$ represents a corrected intensity of the reflected light, i.e., a corrected relative reflectance, $E(\lambda)$ represents an intensity of reflected light from the wafer W to be polished at a wavelength $\lambda$, $B(\lambda)$ represents a reference intensity at the wavelength $\lambda$, $D1(\lambda)$ represents a dark level at the wavelength $\lambda$ measured under a condition that light is cut off immediately before or immediately after the reference intensity $B(\lambda)$ is measured, $F(\lambda)$ represents an intensity of light at the wavelength $\lambda$ transmitted to the spectrometer 26 through the monitoring optical fiber 110 immediately before or immediately after the reference intensity $B(\lambda)$ is measured, $D2(\lambda)$ represents a dark level at the wavelength $\lambda$ obtained under a condition that light is cut off immediately before or immediately after the intensity $F(\lambda)$ is measured, $G(\lambda)$ represents an intensity of light at the wavelength $(\lambda)$ transmitted to the spectrometer 26 through the monitoring optical fiber 110 before the intensity $E(\lambda)$ is measured, and $D3(\lambda)$ represents a dark level at the wavelength $\lambda$ obtained under a condition that light is cut off before the intensity $E(\lambda)$ is measured, and immediately before or immediately after the intensity $G(\lambda)$ is measured.

$E(\lambda)$, $B(\lambda)$, $D1(\lambda)$, $F(\lambda)$, $D2(\lambda)$, $G(\lambda)$, and $D3(\lambda)$ are measured at each of the wavelengths within a predetermined wavelength range. The light-cut-off environment for measuring the dark levels $D1(\lambda)$, $D2(\lambda)$, and $D3(\lambda)$ can be produced by cutting off the light with a shutter (not shown) installed in the spectrometer 26.

The processor 27 stores therein, in advance, the aforementioned correction formula (2) for correcting the intensity of the reflected light from the wafer W. This correction formula is a function including, as variables, at least the intensity of the reflected light from the wafer W, and the intensity of the light transmitted to the spectrometer 26 through the monitoring optical fiber 110. The reference intensity $B(\lambda)$ is an intensity of light that has been measured in advance at each of wavelengths. For example, the reference intensity $B(\lambda)$ is obtained by directly measuring the intensity of light emitted from the first sensor head 61 or the second sensor head 62, or by irradiating a mirror with light from the first sensor head 61 or the second sensor head 62 and measuring the intensity of reflected light from the mirror. Alternatively, the reference intensity $B(\lambda)$ may be an intensity of the reflected light measured by the spectrometer 26 when a silicon wafer (bare wafer) with no film thereon is being water-polished in the presence of water, or when said silicon wafer (bare wafer) is placed on the polishing pad 1. In order to obtain a correct value of the reference intensity $B(\lambda)$, the reference intensity $B(\lambda)$ may be an average of multiple values of intensity of the light which have been measured under the same condition.

The reference intensity $B(\lambda)$, the dark level $D1(\lambda)$, the intensity $F(\lambda)$, and the dark level $D2(A)$ are measured in advance, and inputted in advance into the aforementioned correction formula as constants. The intensity $E(\lambda)$ is measured during polishing of the wafer W. The intensity $G(\lambda)$ and the dark level $D3(\lambda)$ are measured before polishing of the wafer W (preferably, immediately before polishing of the wafer W). For example, before the wafer W is held by the polishing head 5, the processor 27 operates the optical switch 115 to couple the monitoring optical fiber 110 to the spectrometer 26 so that the light emitted by the light source 30 is transmitted to the spectrometer 26 through the monitoring optical fiber 110. The spectrometer 26 measures the intensity $G(\lambda)$ and the dark level $D3(\lambda)$, and sends these measured values to the processor 27. The processor 27 inputs the measured values of the intensity $G(\lambda)$ and the dark level $D3(\lambda)$ into the aforementioned correction formula. Upon completion of measuring the intensity $G(\lambda)$ and the dark level $D3(\lambda)$, the processor 27 operates the optical switch 115 to couple the light-receiving fiber 50 to the spectrometer 26. Thereafter, the wafer W is polished, and the intensity $E(\lambda)$ is measured by the spectrometer 26 during polishing of the wafer W.

During polishing of the wafer W, the processor 27 inputs the measured value of the intensity $E(\lambda)$ into the aforementioned correction formula, and calculates the corrected relative reflectance $R'(\lambda)$ at each of wavelengths. More specifically, the processor 27 calculates corrected relative reflectances $R(\lambda)$ over the predetermined wavelength range. Therefore, the processor 27 can produce a spectral waveform representing a relationship between the corrected relative reflectance (i.e., the corrected intensity of the light) and the wavelength of the light. The processor 27 determines the film thickness of the wafer W based on the spectral waveform according to the method discussed with reference to FIG. 3 to FIG. 5. The processor 27 can determine an accurate film thickness of the wafer W because the spectral waveform is produced based on the corrected intensities of light.

Figure 14:
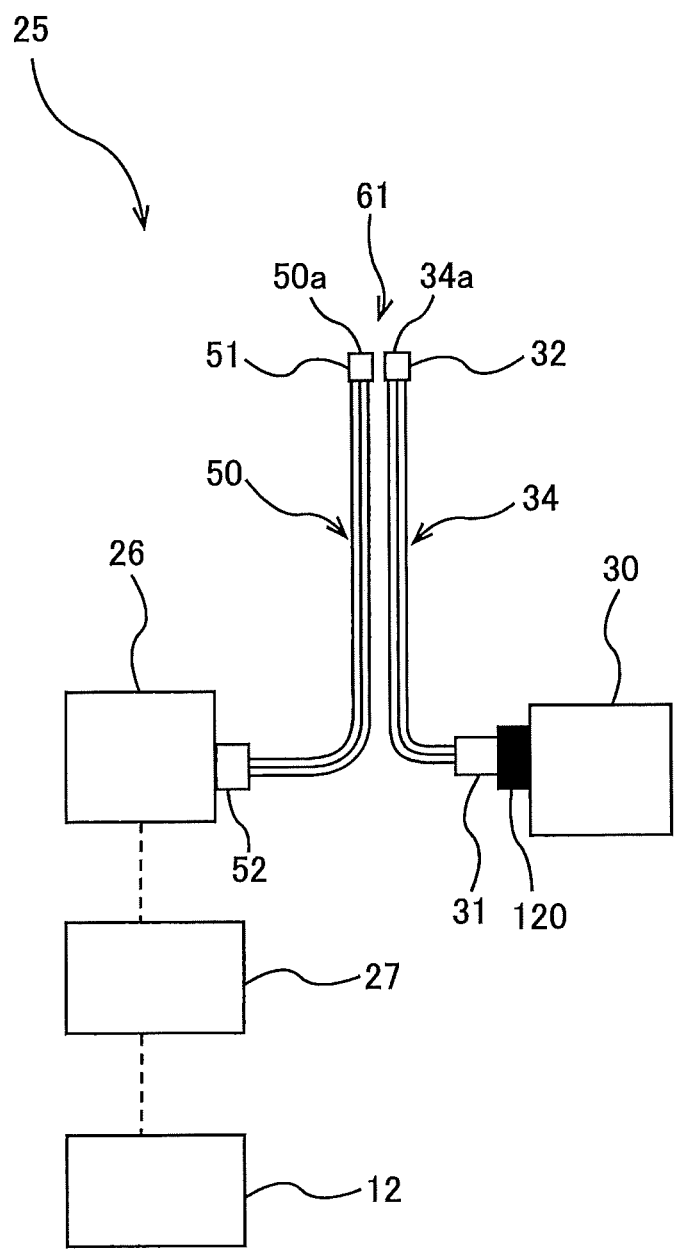
FIG. 14 is an enlarged view showing still another embodiment of the optical film-thickness measuring device (film-thickness measuring apparatus).

FIG. 14 is an enlarged view showing still another embodiment of the optical film-thickness measuring device (film-thickness measuring apparatus) 25. Structures, which are not specifically described, are the same as those shown in FIG. 6, and duplicate descriptions will be omitted. The optical film-thickness measuring device 25 of the present embodiment includes only one sensor head 61. Ends of a plurality of strand optical fibers, constituting the illuminating fiber 34, are bound by binders 31, 32. Ends of a plurality of strand optical fibers, constituting the light-receiving fiber 50, are bound by binders 51, 52.

A dimmer 120 is attached to the illuminating fiber 34. This dimmer 120 has the same configuration as the first dimmer 70 described with reference to FIGS. 7 and 8, or the second dimmer 72 described with reference to FIG. 11. Therefore, duplicate descriptions will be omitted. The quantity of light emitted from the light source 30 is regulated (reduced) by the dimmer 120. The dimmer 120 may have the configuration shown in FIG. 12.

The motor-driven moving mechanism 92 shown in FIGS. 9 and 10 can also be applied to the dimmer 120 shown in FIG. 14. The operation controller 12 is configured to operate the motor-driven moving mechanism 92 until the quantity of light emitted from the illuminating fiber 34 reaches a target value. Specifically, a not-shown reflector (e.g., a wafer, a dummy wafer, or a mirror) is placed on the polishing surface 1a of the polishing pad 1, light is directed to the reflector from the illuminating fiber 34, and the intensity of the reflected light from the reflector is measured by the spectrometer 26. The operation controller 12 operates the electric motor 93 of the motor-driven moving mechanism 92 until the measured value of the reflected light reaches a set value corresponding to the target value.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A polishing apparatus comprising:
a polishing table for supporting a polishing pad;
a polishing head configured to press a wafer against the polishing pad;
a light source;
an illuminating fiber having distal ends arranged at different locations in the polishing table;
a light-receiving fiber having distal ends arranged at the different locations in the polishing table;
a spectrometer coupled to the light-receiving fiber, the spectrometer being configured to decompose reflected light, transmitted from the wafer through the light-receiving fiber, according to wavelength and measure intensity of the reflected light at each of wavelengths;
a processor configured to determine a film thickness of the wafer based on a spectral waveform indicating a relationship between the intensity and the wavelength of the reflected light; and
a first dimmer and a second dimmer attached to the illuminating fiber, wherein each of the first dimmer and the second dimmer includes a base member having a light passage formed therein, an optical-fiber holder inserted in the light passage, and a relative-position adjusting mechanism configured to adjust a position of the optical-fiber holder relative to the base member,
wherein each of the first dimmer and the second dimmer further includes a diaphragm disposed in the light passage,
wherein the illuminating fiber includes a first illuminating fiber and a second illuminating fiber,
one end of the first illuminating fiber and one end of the second illuminating fiber are coupled to the light source,
the other end of the first illuminating fiber and the other end of the second illuminating fiber constitute the distal ends of the illuminating fiber arranged at the different locations, and
the first dimmer is attached to the first illuminating fiber and the second illuminating fiber, and the second dimmer is attached to at least one of the first illuminating fiber and the second illuminating fiber.

2. The polishing apparatus according to claim 1, wherein the optical-fiber holder has a scale on an outer surface thereof.

3. The polishing apparatus according to claim 1, wherein the relative-position adjusting mechanism includes a motor-driven moving mechanism configured to move the optical-fiber holder relative to the base member.

4. The polishing apparatus according to claim 3, further comprising:
an operation controller configured to operate the motor-driven moving mechanism of the first dimmer until a quantity of light, emitted from the illuminating fiber, reaches a target value.

5. The polishing apparatus according to claim 3, further comprising:
an operation controller configured to operate the motor-driven moving mechanism of the second dimmer until quantities of light, emitted from the first illuminating fiber and the second illuminating fiber, become equal to each other.

6. The polishing apparatus according to claim 1, wherein:
a part of the first illuminating fiber and a part of the second illuminating fiber are bound to constitute a trunk optical fiber;
another part of the first illuminating fiber and another part of the second illuminating fiber constitute branch optical fibers branching off from the trunk optical fiber; and
the first dimmer is attached to the trunk optical fiber, and the second dimmer is attached to at least one of the branch optical fibers.

7. A polishing apparatus comprising:
a polishing table for supporting a polishing pad;
a polishing head configured to press a wafer against the polishing pad;
a light source;
an illuminating fiber having distal ends arranged at different locations in the polishing table:
a light-receiving fiber having distal ends arranged at the different locations in the polishing table;
a spectrometer coupled to the light-receiving fiber, the spectrometer being configured to decompose reflected light, transmitted from the wafer through the light-receiving fiber, according to wavelength and measure intensity of the reflected light at each of wavelengths;
a processor configured to determine a film thickness of the wafer based on a spectral waveform indicating a relationship between the intensity and the wavelength of the reflected light and
a first dimmer and a second dimmer attached to the illuminating fiber,
wherein the illuminating fiber includes a first illuminating fiber and a second illuminating fiber,
one end of the first illuminating fiber and one end of the second illuminating fiber are coupled to the light source,
the other end of the first illuminating fiber and the other end of the second illuminating fiber constitute the distal ends of the illuminating fiber arranged at the different locations, and
the first dimmer is attached to the first illuminating fiber and the second illuminating fiber, and the second dimmer is attached to at least one of the first illuminating fiber and the second illuminating fiber;
a monitoring optical fiber coupled to the light source and the spectrometer; and
a third dimmer attached to the monitoring optical fiber.

8. A polishing apparatus comprising:
a polishing table for supporting a polishing pad;
a polishing head configured to press a wafer against the polishing pad;
a light source;
an illuminating fiber having a distal end arranged at a predetermined location in the polishing table;
a light-receiving fiber having a distal end arranged at the predetermined location in the polishing table;

a spectrometer coupled to the light-receiving fiber, the spectrometer being configured to decompose reflected light, transmitted from the wafer through the light-receiving fiber, according to wavelength and measure intensity of the reflected light at each of wavelengths;

a processor configured to determine a film thickness of the wafer based on a spectral waveform indicating a relationship between the intensity and the wavelength of the reflected light; and a dimmer attached to the illuminating fiber, wherein the dimmer includes a base member having a light passage formed therein, an optical-fiber holder inserted in the light passage, and a relative-position adjusting mechanism configured to adjust a position of the optical-fiber holder relative to the base member, and wherein the dimmer further includes a diaphragm disposed in the light passage.

9. The polishing apparatus according to claim 8, wherein the optical-fiber holder has a scale on an outer surface thereof.

10. The polishing apparatus according to claim 8, wherein the relative-position adjusting mechanism includes a motor-driven moving mechanism configured to move the optical-fiber holder relative to the base member.

11. The polishing apparatus according to claim 10, further comprising:

an operation controller configured to operate the motor-driven moving mechanism of the dimmer until a quantity of light, emitted from the illuminating fiber, reaches a target value.

* * * * *